United States Patent [19]

Umemura et al.

[11] Patent Number: 5,148,027
[45] Date of Patent: Sep. 15, 1992

[54] METHOD OF MICROAREA ANALYSIS WITH A FOCUSED CESIUM ION BEAM

[75] Inventors: Kaoru Umemura, Kokubunji; Hiroyasu Schichi, Koganei; Tohru Ishitani, Sayama, all of Japan

[73] Assignee: Hitachi, Ltd., Tokyo, Japan

[21] Appl. No.: 654,299

[22] Filed: Feb. 12, 1991

[30] Foreign Application Priority Data

Feb. 23, 1990 [JP] Japan ................ 2-41006

[51] Int. Cl.⁵ ............................ H01J 37/256
[52] U.S. Cl. ......................... 250/309; 250/306; 250/307
[58] Field of Search ........... 250/309, 306, 302, 423 R, 250/288

[56] References Cited

U.S. PATENT DOCUMENTS

| | | | |
|---|---|---|---|
| 4,163,153 | 7/1979 | Tamura et al. | 250/309 |
| 4,694,170 | 9/1987 | Slodzian et al. | 250/309 |
| 4,894,536 | 1/1990 | Conzemius | 250/288 |
| 4,912,327 | 3/1990 | Waugh | 250/309 |

OTHER PUBLICATIONS

Levi-Setti et al, "Aspects of High Resolution Imaging with a Scanning Ion Microprobe", Ultramicroscopy 24 (1988), 97-114, Amsterdam.

Thompson et al, "Artifacts in High Resolution SIMS: The Contribution of the Ion Source", Vacuum/vol. 34/No. 10/11 pp. 947 to 951/1984, Great Britain.

Swanson et al, "A Comparison of Boron Emission Characteristics for Liquid Metal Ion Sources of PtB, PdB, and NiB", J. Vac. Sci. Technol. B6(1), Jan./Feb. 1988.

Primary Examiner—Jack I. Berman
Assistant Examiner—Kiet T. Nguyen
Attorney, Agent, or Firm—Fay, Sharpe, Beall, Fagan, Minnich & McKee

[57] ABSTRACT

Cs LMIS with pure Cs or a cesium compound as a source material is specifically employed in a FIB so that the total ion current $I_T$ at the time of ion emission is not greater than 5 µA, whereby the current density distribution of a Cs FIB exhibits a sharp peak and the tailing of the distribution is reduced. By setting the $I_T$ in the range of 0.1 to 2 µA, a high current density of a Cs+ FIB whose diameter is 0.1 µm is formed. The FIB is particularly used in secondary ion mass spectrometry analysis of a semiconductor material in electronic device manufacturing.

31 Claims, 4 Drawing Sheets

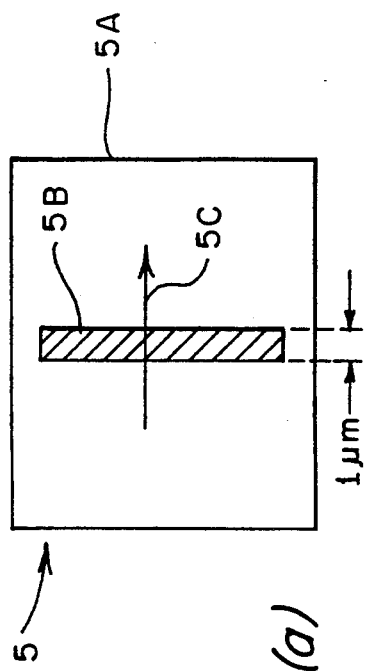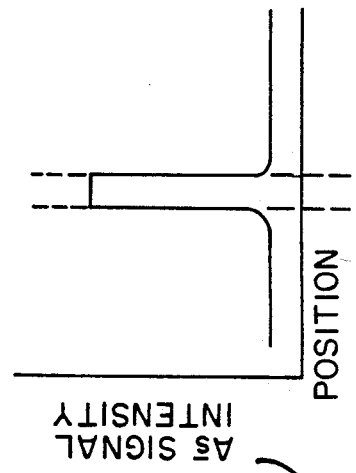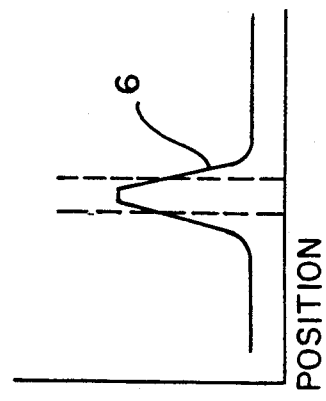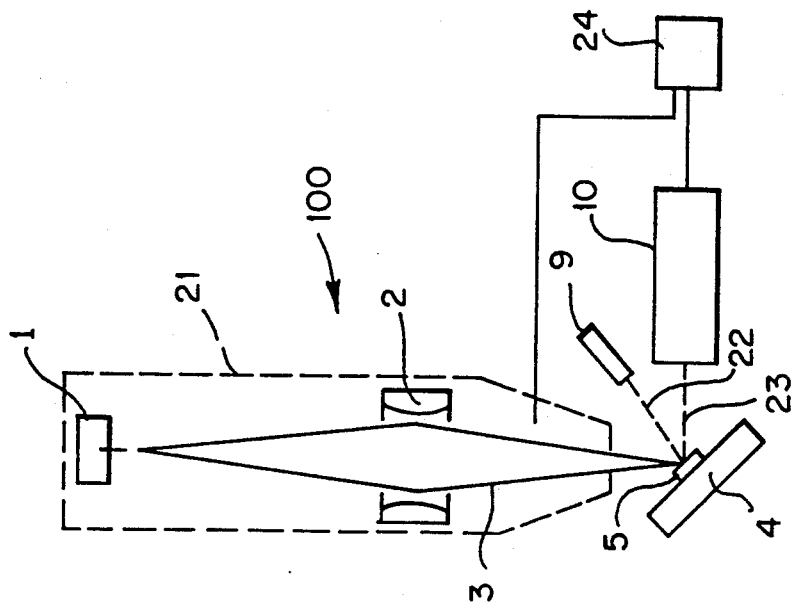
FIG. 2(a)
FIG. 2(b)
FIG. 2(c)
FIG. 1

METHOD OF MICROAREA ANALYSIS WITH A FOCUSED CESIUM ION BEAM

BACKGROUND OF THE INVENTION

The present invention relates to focused cesium ion beams. More specifically, the invention relates to focused cesium ion beams that are useful in analyzing a microarea in the field of material analysis by being employed in secondary ion mass spectrometers for material analysis.

In the field of semiconductors, particularly the microminiturization of semiconductor devices and large scale integration, slight contamination and introduction of micro particles during the process of producing semiconductor devices may affect the operation of the devices and inflict fatal defects in some cases. As cleanliness in the process of producing semiconductor devices is noticeably improved, the amount of contaminants that can be tolerated is reduced, so that ever smaller particles are capable of producing defects. Consequently, high sensitivity and high spatial resolution have become required of apparatus for detecting and analyzing these contaminations and small particles. Secondary ion mass spectroscopy (hereinafter referred to as SIMS) has an intrinsic property than it has a higher sensitivity that surface analyzers and it can make an analysis in the depth direction, so that it is much desired for trace/micropart analysis.

Since cesium ($C_s$) used in SIMS increases the probability of secondary ionization of an element having high ionization potential, such as C, O, H, Au, and Ag, the use of cesium in some forms is well known to be indispensable to the SIMS. A surface ionization $C_s$ ion source, $C_s$ vapor source and the like have been employed for introducing $C_s$ onto a sample surface.

The surface ionization $C_s$ ion source has a low spatial resolution on the analysis area, because the diameter of the ion beam is large. Therefore it is not suitable for trace/micropart analysis, because the low spatial resolution produces a small sample current density.

The $C_s$ vapor source, has a problem that areas other than the analysis area are contaminated by $C_s$. This results in a lack of reliability in the depth direction analysis when a plurality of adjoining areas are analyzed.

As a result, the methods using the surface ionization $C_s$ ion source and $C_s$ vapor source of $C_s$ have not been most preferred when working with trace/micropart analysis or analysis of adjoining areas.

Attention is now being directed to focused ion beams (hereinafter called FIB) for irradiating a submicron area of a sample with high current density ions. The diameter of a FIB is narrowed by focusing to approximately 0.1 $\mu$m on the surface of the sample irradiated. A liquid metal ion source (hereinafter called LMIS) is one of the ion sources for implementing FIB formation. With a LMIS, a high electric field is applied to a needle-shaped emitter, i.e. an emitter having a sharp tip, after the emitter is wetted with liquid ion material. The liquid ion material is thus ionized and emitted by both field evaporation and field ionization. The effectiveness of the LMIS is attributed to the focusing capability of the emitted ion beam that can be focused to approximately 0.1 $\mu$m in diameter, the current density that is higher by several orders of magnitude than that of the beam obtained by the surface ionization source, and the numerous ionic species that can be emitted.

An application of the LMIS technology to a SIMS has already been attempted by using gallium (Ga), which material is easy to handle as an ion material. Microarea analysis has also been carried out using a Ga+ FIB. For instance, R. Levi Setti et al reported such an analysis under the title, "Aspects of High Resolution Imaging With a Scanning Ion Microprobe" (Ultramicroscopy, 24) (1989) pages 97–113. Although the microarea analysis was realized by the application of the Ga+ FIB to SIMS, the shortcoming is that the sensitivity to light elements such as C, H and O is low.

S. P. Thompson discloses an example of mounting a liquid metal cesium ion source (hereinafter called $C_s$ LMIS) on a SIMS in the paper entitled, "Artifact In High Resolution SIMS: The Contribution of the Ion Source" (Vacuum, 34) (1984) pages 947–951. However, the ion beam diameter in this case is still as large as 100 micrometers and no results of submicron area analysis have been obtained. Further, not even the formation of a cesium ion beam of submicron diameter has not been attained.

It is known that a total ion current ($I_T$) range of a $C_s$ LMIS for providing the highest current density can be determined by experimentally passing ion beams through a focusing optical system by adjusting the operational characteristics of LMIS, after first estimating characteristics such as angular intensity and full width at half maximum energy.

SUMMARY

It is an object of the present invention to form a focused cesium ion beam ($C_s$+ FIB) of submicron diameter.

The present invention obtains a specific total ion current range, for forming a high current density FIB, while suppressing the expansion of FIB current intensity to the minimum, in order to minimize the influence of chromatic aberration of an ion beam, when a $C_s$+ FIB is formed by using a $C_s$ LMIS to emit Cs ions.

According to the present invention, $C_s$ LMIS with pure $C_s$ or a cesium compound as a source material is specifically employed so that the total ion current $I_T$ at the time of ion emission is not greater than 5 $\mu$A, whereby the current density distribution of a $C_s$ FIB exhibits a sharp peak and the tailing of the distribution is reduced. By setting the $I_T$ in the range of 0.1 to 2 $\mu$A, a high current density of a $C_s$+ FIB whose diameter is 0.1 $\mu$m is formed with excellent results. In other words, the problems mentioned above can be solved and the objects realized by operating a $C_s$ LMIS with $I_T$ no greater than 5 $\mu$A, and particularly in the range of 0.1 to 2 $\mu$A, so that a FIB having a high current density and small tailing can be formed.

BRIEF DESCRIPTION OF THE DRAWINGS

Further objects, features and advantages of the present invention will become more clear from the following detailed description of a preferred embodiment, with reference to the accompanying drawing, wherein:

FIG. 1 is a diagram illustrating a secondary ion mass spectrometer embodying the present invention;

FIGS. 2(a–c) are diagrams illustrating experimental results obtained from an embodiment of the present invention;

DETAILED DESCRIPTION OF THE PREFERRED EMBODIMENT

With the present invention, a SIMS is provided with a $C_s$ LMIS and a sample is irradiated with a FIB $I_T$ no greater than 5 μA to produce a highly efficient SIMS analysis. In particular, an $I_T$ in the range of 0.1 to 2 μA is most preferable as producing the best results. SIMS and FIB apparatus provided with a $C_s$ LMIS for attaining the stated objects are characterized by a power supply capable of setting $I_T$ at a value no greater than 5 μA while the ion source is operating, and most preferably within the above-noted smaller range and characterized by display of it. When a LMIS is used to form a FIB, the operational characteristics of the ion source substantially determine the extent to which the current density of the FIB is favorably made uniform and the degree to which the current density of the FIB is set relative to FIBs of other kinds of ion species. When the operational characteristics of the ion sources are evaluated in consideration of the convergence of the FIB, important items of evaluation are the tailing of the energy distribution and a convergence parameter taking the angular intensity and full width at half maximum into consideration. A description of these operational characteristics will be given.

The energy of ions emitted from a LMIS have varied from several eV to several tens eV in terms of full width at half maximum. As these variations originate from an ion producing mechanism, the energy cannot be decreased to less than several eV. When emitted ions converge on a sample, the spreading (full width at half maximum, hereinafter referred to as ΔE) of the energies that the ions themselves have is reflected as chromatic aberration of a FIB when probe current $I_P$ on the sample exceeds several nA; the greater the ΔE, the greater the chromatic aberration becomes. In other words, the beam cannot be focused to an extent less than the blur amount due to the chromatic aberration. Consequently, the ion source according to the present invention is operated in a region where ΔE is as small as possible.

However, the spreading, ΔE (eV), of the energies of the emitted ions differs with respect to the ion materials and the ion species to be emitted even though the total ion current $I_T$ remains the same. The ΔE generally increases as $I_T$ increases and tends to become large in proportion to the ion mass number. Although attempts have been made to simulate ΔE in consideration of Coulomb repulsion, it is still impossible to compute ΔE as an operational model. As a result, ΔE must be actually measured through experiments.

Figure 3:
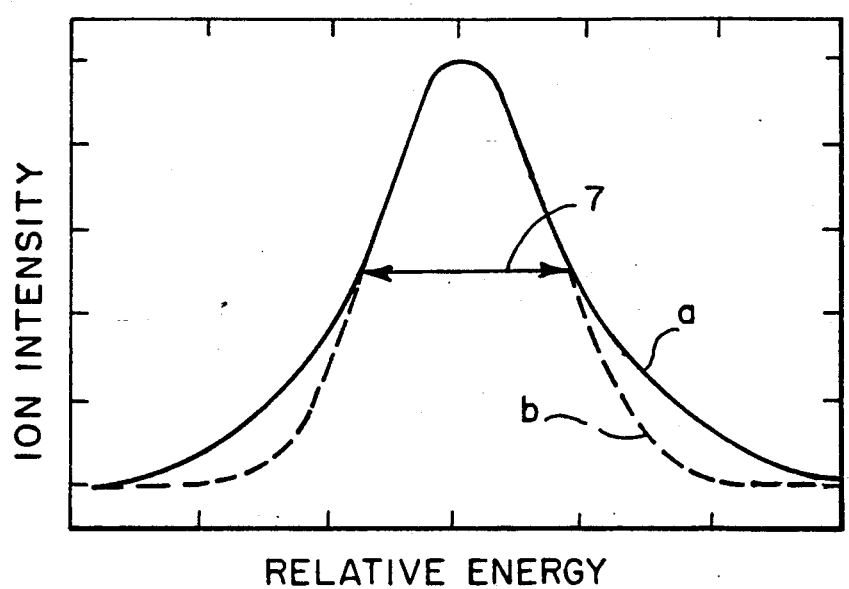
FIG. 3 is a graph illustrating the tailings of energy distribution.

Measurement of actual current density distribution, in the radial direction of a FIB, reveals that the distribution has a tailing wider than that of the Gaussian distribution and the tailing is longer than the distribution estimated in terms of full width at half maximum, as indicated by reference numeral 7 in FIG. 3. When the energy distribution, curve b of FIG. 3, has a sharp peak and broad width smaller than that of a distribution as shown by curve a of FIG. 3, the current density distribution of the ion beam has a small tailing and a steep peak, providing a good focusing capability. Consequently, the present invention involves the above analysis and recognition that an energy analysis of emitted ions, to obtain a preferred range of $I_T$ that causes the emission of the ions to exhibit the energy distribution having a small tailing as shown by the curve b in FIG. 3 obtains the objects stated and overcomes problems found in the prior art.

For the purpose of analyzing the effectiveness of the present invention, it is useful to consider a figure of merit, defined as follows: assuming a spread angle of the ions emitted from the ion source is $2\alpha_0$ (rad) and an angular intensity is dI/dΩ (μA/sr), Ip is given by the following equation.

$$I_p = (\pi \alpha_0^2)(dI/d\Omega)$$

Since dI/dΩ differs according to $I_P$ and the ion specie, it must be obtained actually from experiments. If the ion source is operated in a range where $I_P$ is lower than several nA, the following relation is established between $I_P$ and the beam diameter d.

$$d \alpha I_p^{\frac{1}{2}}$$

The beam current density $J(=4I_p/\pi d^2)$ in this region does not depend on d but conforms to the following equation using dI/dΩ and ΔE:

$$J = K(dI/d\Omega)/(\Delta E)^2$$

where constant K concerns lens magnification, a chromatic aberration coefficient and an ion optical system. Therefore, it is recognized to operate the ion source in a region the parameter $[(dI/d\Omega)/(\Delta E)^2]((\mu A/sr)/(eV)^2)$ is maximized in order to form an FIB having a higher current density. The parameter $[(dI/d\Omega)/(\Delta E)^2]$ is known herein as the "figure of merit." For evaluation whether the FIB to be formed is high in current density, dI/dΩ and ΔE of the ion source are measured to obtain the figure of merit, whereby the relative evaluation of a FIB of different ion species becomes possible, without passing the ion beam through a focusing lens system. However, the good conditions vary with the ion specie and source material to be emitted, so that actual good conditions are only obtained by carrying out experiments for actually obtaining the figure of merit or mounting the ion source in the ion emission apparatus. In other words, preferred conditions cannot be made known merely by theoretic examinations.

Figure 4:
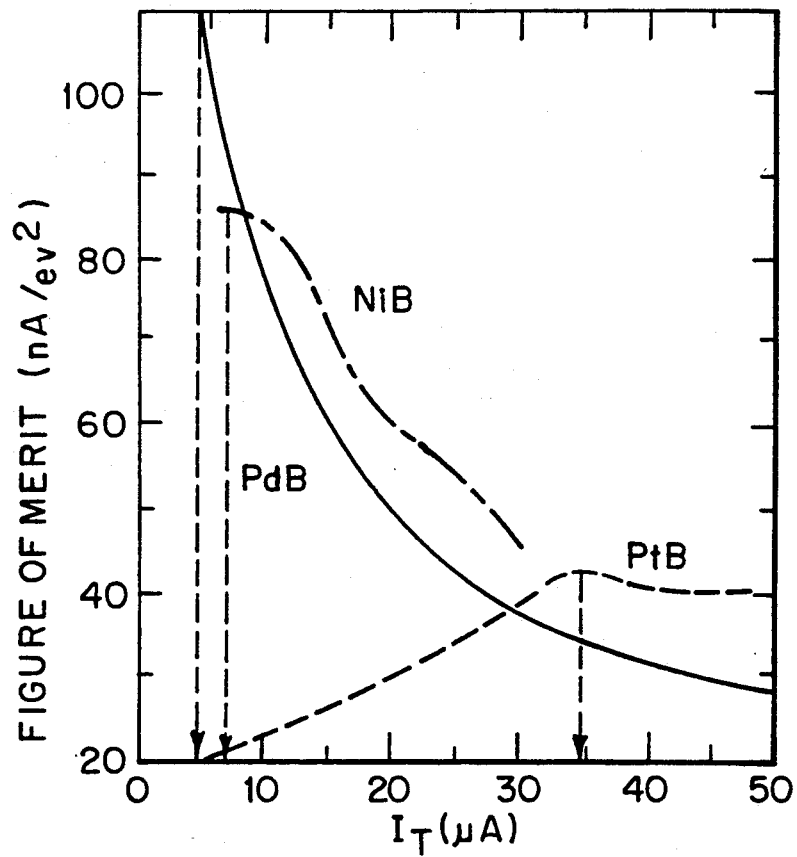
FIG. 4 is a graph illustrating the relationship between the figure of merit and a total ion current of a liquid metal boron ion source using three kinds of source material.

An example will be shown wherein total ion current whose figure of merit is maximized varies with source material. FIG. 4 shows the result of an experiment to obtain the figure of merit concerning LMIS for emitting boron ions (B+) using PtB (platinum-boron alloy), NiB (nickel-boron alloy) and PdB (palladium-boron alloy) as source materials. L. W. Swanson et al showed detailed results of experiments in their paper under the title, "A Comparison of Boron Emission Characteristics for Liquid Metal Ion Sources of PtB, PdB, and NiB" (J. Vac. Sci. Technol. B6 (1988) pages 491-498). The present inventors recognize that the total ion current maximizing the figure of merit varies with the ion material. In other words, even though the preferred operational conditions of the ion source using an alloy containing desired elements as an ion material are obtained, the conditions obtained cannot be the same for other ion materials. Therefore, the preferred operational condition of an ion source cannot be determined unless the energy distribution and angular intensity of each ion material are measured. FIG. 4 shows an example explaining the above analysis.

In order to obtain the preferred operational condition of a $C_s$ LMIS as shown in FIG. 4, experiments and evaluation should be made, and such preferred operational conditions cannot be obtained readily by analogical inference from data on ion sources using other ion species. With respect to $C_s^+$ energy analysis, few reports have been presented. The above-mentioned document shows data limited to the case where $I_T$ is 10 μA. It is the present invention, that has made clear the details of the $C_s^+$ energy distribution, such as the variations of the energy distribution when the total ion current is changed, and the importance of the tailing of the ion intensity distribution three to four digits smaller than the peak when the ion intensity is measured with high sensitivity.

As $dI/d\Omega$ value of $C_s^+$ has not been measured before the present invention, the figure of merit $[(dI/d\Omega)/(\Delta E)^2]$, with special emphasis placed on the formation of $C_s^+$ FIB, was left unevaluated prior to the present invention. Since not only the evaluation of the ion source but also the convergence of a FIB of 1 μm or less in diameter has not been made prior to the present invention, this evaluation is a part of the present invention in obtaining the preferred operational condition of a $C_s$ LMIS, the condition stated above being the realization of one such evaluation under which the spreading of the beam current density is diminutively made uniform while the diameter of the $C_s$ FIB is reduced to approximately 0.1 μm and thus the highest current density is attained.

The present invention obtains operating conditions (e.g., the $I_T$ range) under which the spreading of an ion beam current density is narrowed when a $C_s$ FIB is employed for secondary ion mass analyzing in a microarea on the surface of a sample and to obtain the highest current density in such a state that the ion beam is focused, whereby analysis of elements such as light elements in silicon substrates can be made with high spatial resolution and high sensitivity.

When the masses of ions emitted from the $C_s$ LMIS was analyzed, the presence of molecular ions of $C_{s2}^+$, $C_{s3}^+$ and the like in addition to $C_s^+$ was found. When a cesium liquid metal ion source is mounted on a focused ion emission apparatus to form a focused ion beam, the method used is mass-separating $C_s^+$ ions which form the largest current to focus them, or non-mass-separating them to focus the total emitted ions. Consequently, a $C_s$ FIB can be evaluated if $C_s^+$ emission characteristics are made clear.

First, the energy distribution of $C_s^+$ emitted from $C_s$ LMIS was obtained. The experimental method of obtaining energy distribution comprises the steps of installing a $C_s$ LMIS as an ion source of a double focusing type mass spectrometer, setting the electric field intensity constant, setting the magnetic intensity in such a way as to allow the passage of particular ions ($C_s^+$) therethrough, scanning the ion accelerating voltage and recording the ion current intensity flowing into a detector in correspondence with the ion accelerating voltage. If a pulse counter is used for the detector, then a wide dynamic range of signals is obtained and distribution, including very weak intensity such as the tailing, which is four to five orders below the peak, can be obtained.

Figure 5:
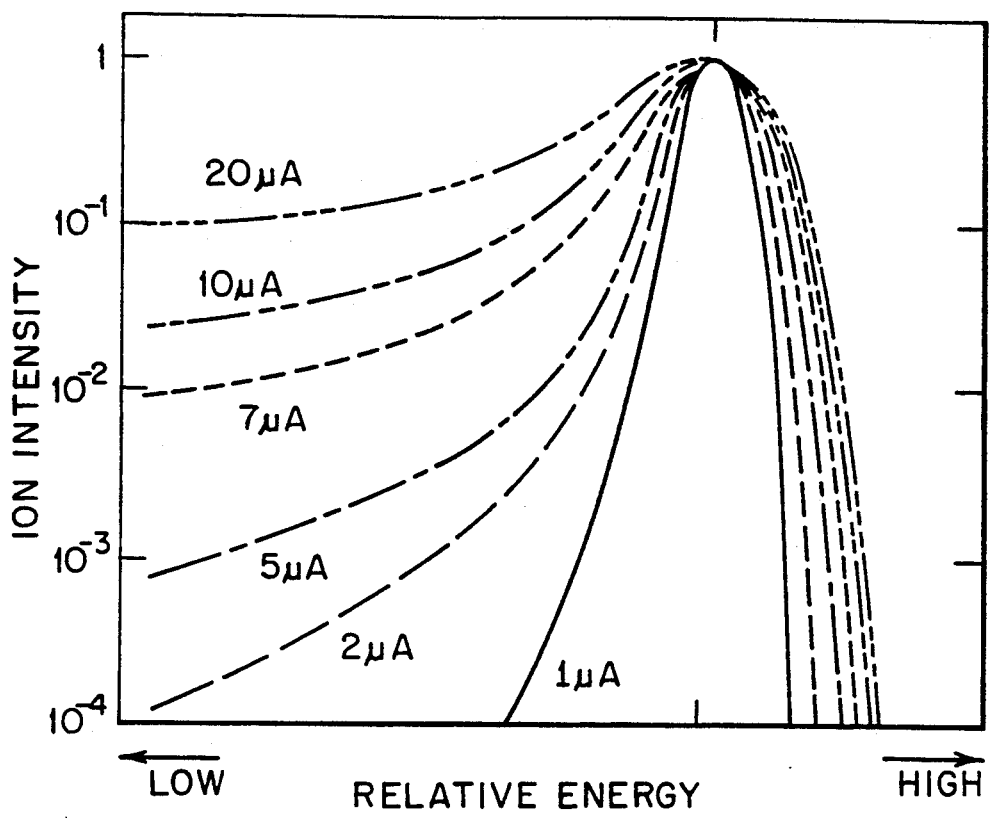
FIG. 5 is a graph illustrating the results of energy measurement in a logarithmic representation of $C_s^+$ energy distribution with respect to various total ion currents.

FIG. 5 is a logarithmic representation of $C_s^+$ energy distribution with respect to various values of $I_T$. Each one of the distributions is asymmetric and conspicuous tailing is observed on the lower energy side. The tailing causes the FIB beam to blur. When the $I_T$ is not greater than 5 μA, however, it is seen that the tailing of the energy distribution is small, even 3 digits below the peak. In view of the tailing of the energy distribution, i.e., the tailing of the focused ion beam current density distribution, it is seen that the operation condition of LMIS in terms of $I_T$ is desirably not greater than 5 μA.

Figure 6:
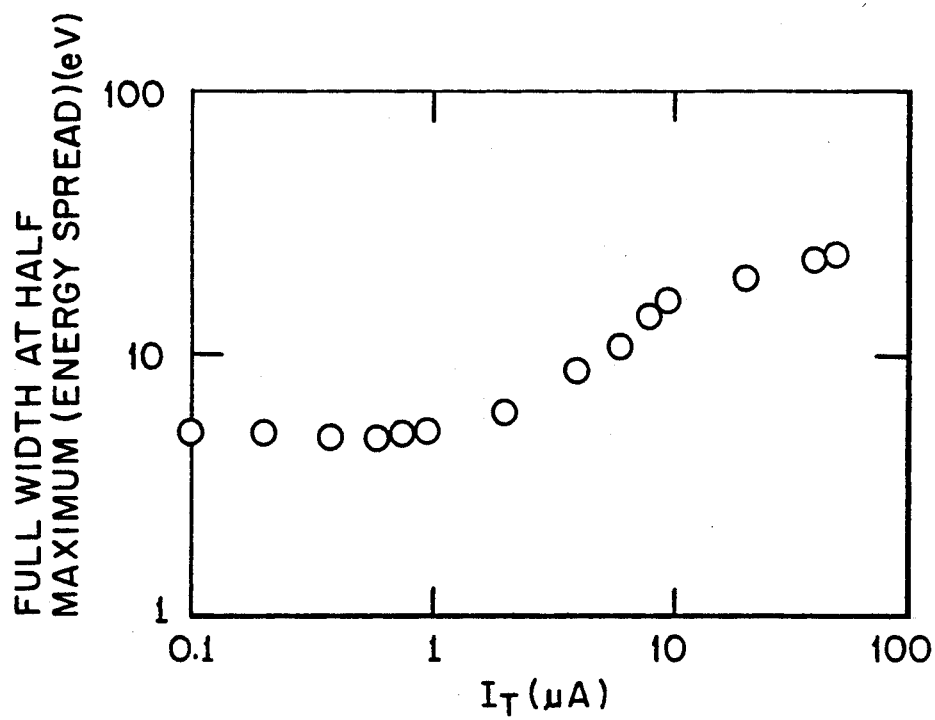
FIG. 6 is a graph illustrating experimental results concerning the relationship between the full width at half maximum energy of $C_s^+$ emitted from a liquid metal cesium ion source and the total ion current.
Figure 7:
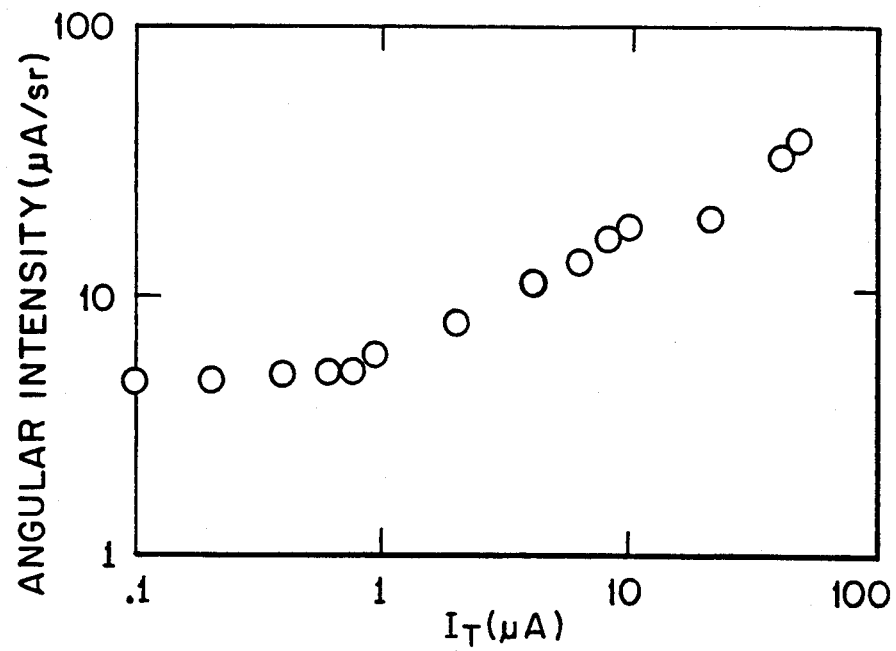
FIG. 7 is a graph illustrating experimental results relating the angular intensity of $C_s^+$ emitted from the liquid metal cesium ion source and the total ion current.

FIG. 6 is a graph in a log-log scale showing the relation experimentally-obtained between full width at half maximum energy ($\Delta E$) of $C_s^+$ emitted from the $C_s$ LMIS and the total ion current $I_T$. When the $I_T$ is, for example, 1 μA or less, $\Delta E$ is approximately 5 eV, and when it is 10 μA, $\Delta E$ is approximately 15 eV; $\Delta E$ increases as $I_T$ increases. FIG. 7 shows the $C_s^+$ angular intensity ($dI/d\Omega$) with respect to $I_T$. The $dI/d\Omega$ value also tends to increase as $I_T$ increases. When $I_T$ was 1 μA, for instance, $dI/d\Omega$ measured was approximately 5 μA/sr.

Figure 8:
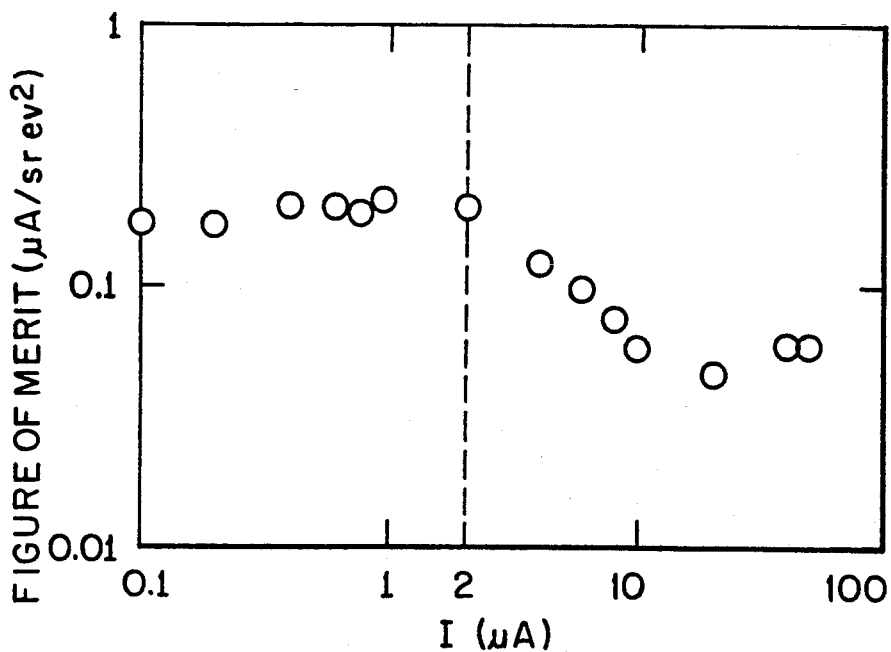
FIG. 8 is a graph illustrating the relationship between the figure of merit of $C_s^+$ emitted from the liquid metal cesium ion source and the total ion current, and the most advantageous condition under which the liquid metal cesium ion source is operated.

FIG. 8 is a graph showing the figure of merit $[(dI/d\Omega)(\Delta E)^2]$ with respect to $I_T$ on the basis of the experimental data of FIGS. 6 and 7. The figure of merit is the maximum when $I_T$ is in the neighborhood of 2 μA and sharply decreases as $I_T$ increases. In other words, if $I_T$ is increased to make the ion beam current arriving at the surface of the sample larger, the chromatic aberration of the ion beam increases and the ion beam tends to become hard to focus. Accordingly, the operational condition under which the cesium ion beam was focused on the surface of the sample without impairing the beam current density is such that the $C_s$ LMIS is operated in the neighborhood of less than 2 μA.

Judging from the measurement of the energy distribution, preferably $I_T$ should be not greater than 5 μA to form a focused cesium ion beam whose current density distribution has no significant tailing. Further, judging from the figure of merit, most preferably $I_T$ should be in the range of 0.1 to 2 μA for a focused cesium ion beam having a higher current density.

A description will be given of the sample subjected to secondary ion mass analysis with a $C_s^+$ FIB formed using a $C_s$ LMIS according to the present invention with reference to FIG. 1. FIG. 1 illustrates an embodiment for secondary ion mass analysis. FIG. 1 is a schematic block diagram of a secondary ion mass spectrometer, with a liquid metal ion source (LMIS), a focused ion beam (FIB) 3, a sample 5 and a quadruple mass separator (Qms) 10. The overall device is called a secondary ion mass spectrometer 100. Ions emitted from the LMIS 1 are focused by a focusing lens 2 and the sample 5 placed on a sample stage 4 is irradiated with the FIB 3. In this device, an ion optical system 2 including the LMIS 1 and the focusing lens 2 further comprises a beam deflector, a blanker, an aperture and the like in addition to the other mentioned components, all within a housing 21. Since this configuration is similar to that of any conventional FIBs, the further description and illustration are omitted.

When the sample 5 is irradiated with the FIB 3, secondary ions 22 and secondary electrons 23 are produced from the irradiated part of the sample. The secondary ions 22 are introduced to the quadruple mass separator (Qms) 10 where the ions 22 are subjected to mass-separation, so that the elements constituting the sample 5 are determined. When the secondary electrons 23 are introduced to a secondary electron detector 9 and when scanning of an electron beam 7 is synchronized with scanning of a CRT 24 used as a monitor, a secondary electron image of the sample is formed, whereby the sample becomes observable. Whether or not detailed observation can be done depends on the focus condition of the FIB 3.

As a specific example, the source material used in the LMIS 1 was pure cesium. The sample 5 was prepared by linearly implanting arsenic ions in a silicon substrate 5A over an area 5B 20 $\mu$m in length and 1 $\mu$m in width. A $C_s$ FIB 3 of acceleration energy 20 keV obtained from the LMIS 1 was scanned 50 $\mu$m in the direction 5C perpendicular to the linear pattern of the sample as shown in FIG. 2(a). The quality of the secondary electron image and the signal intensity pattern of the secondary As$^-$ ions obtained by the Qms 10 were examined by changing the total emitted ion current from 0.1 to 50 $\mu$A. The ion drawing voltage was altered in order to change $I_T$, the focusing lens voltage was finely adjusted from time to time and adjustment was made to focus the beam to the utmost. The results obtained are as follows:

FIG. 2(a) shows the linear pattern of the sample;

FIG. 2(b) shows the intensity pattern of the secondary ion As$^-$ signal resulting from scanning by a satisfactorily focused FIB; and FIG. 2(c) shows the secondary As$^-$ signal pattern resulting from scanning by an unsatisfactorily focused FIB.

When $I_T$ was not greater than 5 $\mu$A, the linear pattern of the secondary electron image could be obtained clearly and the secondary electron image resolution reached approximately 0.05 $\mu$m. With $I_T$ being not less than 10 $\mu$A, on the other hand, the secondary electron image resolution was as bad as 0.5 $\mu$m even though the focusing lens and the like were adjusted. As the $I_T$ increased, the resolution became worse. It was thus found that the focusing capability of the FIB was good with $I_T$ being not greater than 5 $\mu$A and bad at not less than 5 $\mu$A. Moreover, the secondary ion As$^-$ signal distribution obtained by scanning on the linear pattern from each $I_T$, revealed that the shape sharply rose as shown in FIG. 2(b) to accurately reflect the surface composition of the sample with $I_T$ being not greater than 5 $\mu$A, whereas with $I_T$ being not less than 5 $\mu$A, the boundary of the pattern is unclear. As shown in FIG. 2(c), by way of an example, with the ion beam thus irradiated not focused, the beam has a tailing 6 as shown in the case of $I_T$=10 $\mu$A. It is impossible to perform element analysis with high sensitivity for a particular microarea in such a range of $I_T$s that produces substantial tailing.

With the measurement of the distribution in the depth direction of the arsenic thus implanted changing $I_T$, the distribution of arsenic concentration in the substrate from the highest concentration to a lower concentration several orders below could also be determined by changing $I_T$ from 0.1 to 2 $\mu$A. This means that since the focusing capability of a FIB in this range of $I_T$s is very good and since the tailing of the ion beam current density distribution is specifically small, data in areas other than the desired analyzed area are not collected in the tail of the beam even after the analyzing sample is sputtered. This also means that reliability of the result of analysis in the depth direction is improved.

As a result, an $I_T$ of not greater than 5 $\mu$A is desirable for the formation of a $C_s$ FIB, and if the $C_s$ FIB is to be applied to depth analysis with high accuracy, an $I_T$ in the range of 0.1 to 2 $\mu$A is more preferable.

The $I_T$ was controlled by a constant current/constant voltage extracting power supply capable of outputting $I_T$ in the ranges of 10-100 nA, 0.1-1 $\mu$A, 1-10 $\mu$A, 10-100 $\mu$A, and 100 $\mu$A-1 mA; then $I_T$ can be displayed by an analog meter and a digital meter. Although a quadruple mass separator was used as the mass analyzing unit during the experiments, a mass spectrometer with a sector magnet may be used, for example,. With respect to the FIB apparatus comprising the FIB optical system and secondary electron detector, excepting the analyzing units, the preferable operating range of the ion source for forming a cesium focused ion beam was found.

Pure cesium $C_s$ was used as an ion material in the example. However, a focused cesium ion beam may be formed in the same preferred operation range of the ion source by ionizing $C_s$ from a compound of cesium, for example cesium chloride, cesium iodide, chromic acid cesium, cesium carbonate or the like.

In forming a focused cesium ion beam according to the present invention, $C_s^+$ ions having a narrow spreading of energies, high angular intensity and energy distribution and small in tailing can be extracted from a $C_s$ LMIS, so that a sharp $C_s^+$ FIB is formed. When a microarea is analyzed with a $C_s^+$ FIB, for instance, not only the spatial resolution of the analyzing area but also analysis sensitivity are increased, with the effect that the measurement of the distribution of concentration in the depth direction has improved reliability as compared to the reliability of the prior art.

While a preferred embodiment has been set forth along with modifications and variations to show specific advantageous details of the present invention, further embodiments, modifications and variations are contemplated within the broader aspects of the present invention, all as set forth by the spirit and scope of the following claims.

What is claimed is:

1. A method of producing a focused cesium ion beam, comprising the steps of:

providing a sample to be irradiated by a cesium ion beam;

producing, by ion emission, a cesium ion beam from an ion source including a material at least containing cesium to maintain a total ion current of not greater than 5 $\mu$A while the sample is being irradiated by the ion beam; and thereafter focusing the cesium ion beam.

2. The method of claim 1, including setting the total ion current at the time of ion emission to be within a range of 0.1 to 2 $\mu$A.

3. The method of claim 2, wherein said step of producing produces the cesium ion beam with an energy of no greater than approximately 10 eV; and wherein said step of producing employs a liquid metal ion source of cesium.

4. The method of claim 3, further including scanning a CRT monitor synchronized with scanning of the focused cesium ion beam along the sample to produce a visible secondary electron image of the sample scanned.

5. The method of claim 1, wherein said step of producing produces the cesium ion beam with an energy of no greater than approximately 10 eV.

6. The method of claim 1, further including separating $Cs+$ from other molecular ions such as $Cs_2+$ and $Cs_3+$, and only focusing the $Cs+$ ions.

7. The method of claim 1, further including scanning a CRT monitor synchronized with said scanning of the focused cesium ion beam along the sample to produce a visible secondary electron image of the sample scanned.

8. The method of claim 1, wherein said step of producing employs a liquid metal ion source of cesium.

9. A method of submicron analysis of a material in the production of integrated electronic devices, comprising analyzing a material as the sample with a secondary ion mass spectrometer with a focused ion beam produced according to claim 1, further comprising:
focusing the cesium ion beam to a diameter of less than one micron on the surface of the semiconductor material.

10. The method of claim 9, including scanning the surface of the material with the thus focused ion beam, along scanning lines for adjacent areas.

11. The method of claim 10, further including scanning a CRT monitor in sync with said scanning of the focused cesium ion beam to produce a visible secondary electron image of the material.

12. The method of claim 9, wherein said focusing focuses the ion beam to a diameter of no greater than approximately 0.1 $\mu$m.

13. The method according to claim 12, including limiting the total ion current to within the range of 0.1 to 2 $\mu$A; and
wherein said step of producing produces the cesium ion beam with an energy of no greater than approximately 10 eV.

14. A method according to claim 13, further including scanning a CRT monitor in sync with scanning of the focused cesium ion beam to produce a visible secondary electron image of the material.

15. A method according to claim 14, wherein said step of producing uses a cesium ion source that includes at least one liquid metal of cesium chloride, cesium iodine, cesium chromate and cesium carbonate; and
further including separating $C_s+$ from other molecular ions such as $C_{s2}+$ and $C_{s3}$, and only focusing the $C_s+$ ions onto the material.

16. A method according to claim 14, comprising focusing the cesium ion beam to a diameter of about 0.1 micron on the surface of the material.

17. A method according to claim 16, including scanning the surface of the material with the thus focused ion beam, along scanning lines for adjacent areas.

18. A method according to claim 17, applied to depth analysis of the material.

19. The method of claim 9, wherein said step of producing produces the cesium ion beam with an energy no greater than approximately 10 eV.

20. The method of claim 9, further including separating $C_s+$ from other molecular ions such as $C_{s2}+$ and $C_{s3}+$, and only focusing the $C_s+$ ions onto the material.

21. The method of claim 9, applied to depth analysis of the material.

22. The method of claim 9, wherein said step of producing employs a liquid metal ion source of cesium.

23. The method of claim 22, including scanning the surface of the material with the thus focused ion beam, along scanning lines for adjacent areas.

24. The method of claim 23, wherein said focusing focuses the ion beam to a diameter of no greater than approximately 0.1 $\mu$m.

25. The method of claim 24, applied to depth analysis of the material.

26. The method of claim 24, wherein said step of producing produces the cesium ion beam with an energy no greater than approximately 10 eV.

27. A method according to claim 26, further including scanning a CRT monitor in sync with said scanning or the focused cesium ion beam to produce a visible secondary electron image of the materail 28. A secondary ion mass spectrometer, comprising:
means for producing a cesium ion beam from a cesium ion source;
an ion focusing lens for focusing the cesium ion beam;
a sample stage intersecting the focused cesium ion beam;
a secondary ion analyzer operatively associated with the sample stage for analyzing a sample on the sample stage that is irradiated with the focused cesium ion beam; and
control means maintaining the total ion current emitted by the cesium ion source to a value not greater than 5 $\mu$A while the sample is irradiated with the focused cesium ion beam.

29. The spectrometer of claim 28, wherein the control means limits the total ion current to within the range of 0.1 to 2 $\mu$A.

30. The spectrometer of claim 28, wherein said control means includes a power supply setting the total ion current at the value not greater than 5 $\mu$A while the cesium ion source is operating.

31. The spectrometer of claim 28, wherein the cesium ion source includes at least one liquid metal of cesium chloride, cesium iodine, cesium chromate and cesium carbonate.

* * * * *